(12) United States Patent
Han

(10) Patent No.: US 7,585,723 B2
(45) Date of Patent: Sep. 8, 2009

(54) METHOD FOR FABRICATING CAPACITOR

(75) Inventor: Ky-Hyun Han, Kyoungki-do (KR)

(73) Assignee: Hynix Semiconductor Inc, Kyoungki-Do (KR)

( * ) Notice: Subject to any disclaimer, the term of this patent is extended or adjusted under 35 U.S.C. 154(b) by 418 days.

(21) Appl. No.: 11/706,712

(22) Filed: Feb. 13, 2007

(65) Prior Publication Data
US 2007/0202687 A1 Aug. 30, 2007

(30) Foreign Application Priority Data
Feb. 28, 2006 (KR) ........................ 10-2006-0019612
Nov. 30, 2006 (KR) ........................ 10-2006-0120002

(51) Int. Cl.
*H01L 21/337* (2006.01)
*H01L 21/8238* (2006.01)
*H01L 21/8234* (2006.01)
*H01L 21/8242* (2006.01)
*H01L 21/336* (2006.01)
*H01L 21/8222* (2006.01)
*H01L 21/20* (2006.01)
*H01L 21/44* (2006.01)
*H01L 21/4763* (2006.01)

(52) U.S. Cl. .................... 438/239; 438/190; 438/210; 438/218; 438/238; 438/244; 438/253; 438/254; 438/296; 438/329; 438/386; 438/396; 438/597; 438/629; 438/669; 257/E21.647; 257/E21.648; 257/E21.649; 257/E21.651

(58) Field of Classification Search ........ 257/E21.647, 257/E21.648, E21.649, E21.651
See application file for complete search history.

(56) References Cited

U.S. PATENT DOCUMENTS

2008/0003741 A1* 1/2008 Park et al. .................... 438/238

FOREIGN PATENT DOCUMENTS

| KR | 2001-0060040 | 7/2001 |
| KR | 10-2005-0068336 | 7/2005 |
| KR | 10-2005-0107027 | 11/2005 |
| KR | 10-2006-0105851 A | 10/2006 |

\* cited by examiner

*Primary Examiner*—Savitri Mulpuri
*Assistant Examiner*—Mohsen Ahmadi
(74) *Attorney, Agent, or Firm*—Blakely, Sokoloff, Taylor & Zafman LLP

(57) ABSTRACT

A method for fabricating a semiconductor device includes forming an insulation structure over a substrate structure including contact plugs, etching the insulation structure to form opening regions each of which has a lower opening portion having a critical dimension wider than an upper opening portion, and forming a conductive layer contacting the contact plugs inside the opening regions.

26 Claims, 7 Drawing Sheets

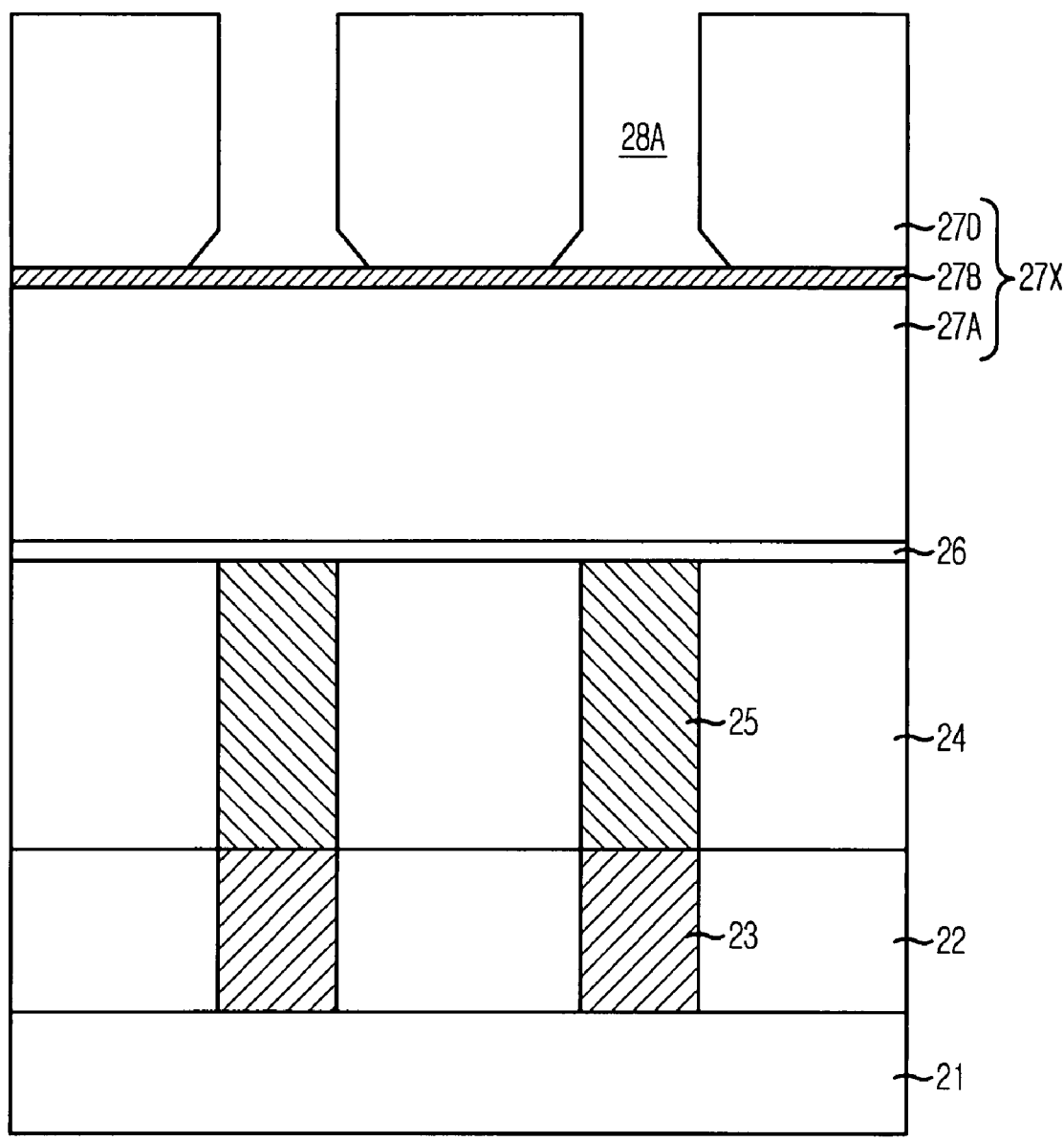

METHOD FOR FABRICATING CAPACITOR

CROSS-REFERENCES TO RELATED APPLICATIONS

The present invention claims priority of Korean patent application numbers 10-2006-0019612 and 10-2006-0120002, respectively filed on Feb. 28, 2006 and Nov. 30, 2006, respectively, which are incorporated by reference in their entirety.

BACKGROUND OF THE INVENTION

The present invention relates to a method for fabricating a semiconductor device, and more particularly, to a method for fabricating a capacitor in a semiconductor device.

As semiconductor devices are being developed toward large-scale of integration, miniaturization and high-speed, areas for capacitors are decreasing. However, despite this developmental trend, capacitors need to have a minimum level of capacitance to drive semiconductor devices. Recently, as semiconductor devices are being scaled down to several nanometers, the height of an inter-layer where capacitors are to be formed increases to secure the capacitance of capacitors.

FIG. 1 is a sectional view to illustrate a conventional method for fabricating a capacitor. A first inter-layer insulation layer 12 is formed on a substrate 11, and landing contact plugs 13 passing through the first inter-layer insulation layer 12 are formed over the substrate 11. A second inter-layer insulation layer 14 is formed on the first inter-layer insulation layer 12 and the landing contact plugs 13, and etched to form storage node contact holes (not shown). Storage node contact plugs 15 filling the storage node contact holes are formed. An etch barrier layer 16 and a bottom electrode isolation layer 17 are formed over the above resultant structure. The bottom electrode isolation layer 17 and the etch barrier layer 16 are etched to form opening regions X where bottom electrodes are to be formed.

In general, a height H of the bottom electrode isolation layer 17 is increased to obtain an intended level of capacitance. However, due to the large-scale of integration, the height H of the bottom electrode isolation layer 17 needs to increase in order to obtain a sufficient level of capacitance. Due to the increase in the height H of the bottom electrode isolation layer 17, remnants are more likely to be generated when the bottom electrode isolation layer 17 and the etch barrier layer 16 are etched. As a result, the etching may not further proceed as reference denotation B illustrates. Alternatively, even if the etching proceeds, a bottom area of the opening region X may become narrowed as reference denotation A illustrates.

SUMMARY OF THE INVENTION

A specific embodiment of the present invention is directed to provide a method for fabricating a capacitor in a semiconductor device advantageous for achieving an intended level of capacitance by reducing an improper etching and a decreasing bottom area of an opening region when forming the opening region where a bottom electrode is to be formed.

Another specific embodiment of the present invention is directed to provide a method for fabricating a semiconductor device advantageous of reducing an improper etching and a decreasing bottom area of an opening region when forming the opening region for an upper contact portion.

In accordance with one aspect of the present invention, there is provided a method for fabricating a semiconductor device. The method includes forming an insulation structure over a substrate structure including contact plugs, etching the insulation structure to form opening regions each of which has a lower opening portion having a critical dimension wider than an upper opening portion, and forming a conductive layer contacting the contact plugs inside the opening regions.

In accordance with another aspect of the present invention, there is provided a method for fabricating a capacitor. The method includes forming a bottom electrode isolation structure over a substrate structure including storage node contact plugs, etching the bottom electrode isolation structure to form opening regions each of which has a lower opening portion having a critical dimension wider than an upper opening portion, and forming bottom electrodes contacting the storage node contact plugs inside the opening regions, respectively.

BRIEF DESCRIPTION OF THE DRAWINGS

FIGS. 2A to 2F are sectional views to illustrate a method for fabricating a capacitor in accordance with an embodiment of the present invention.

DESCRIPTION OF SPECIFIC EMBODIMENTS

Figure 1:
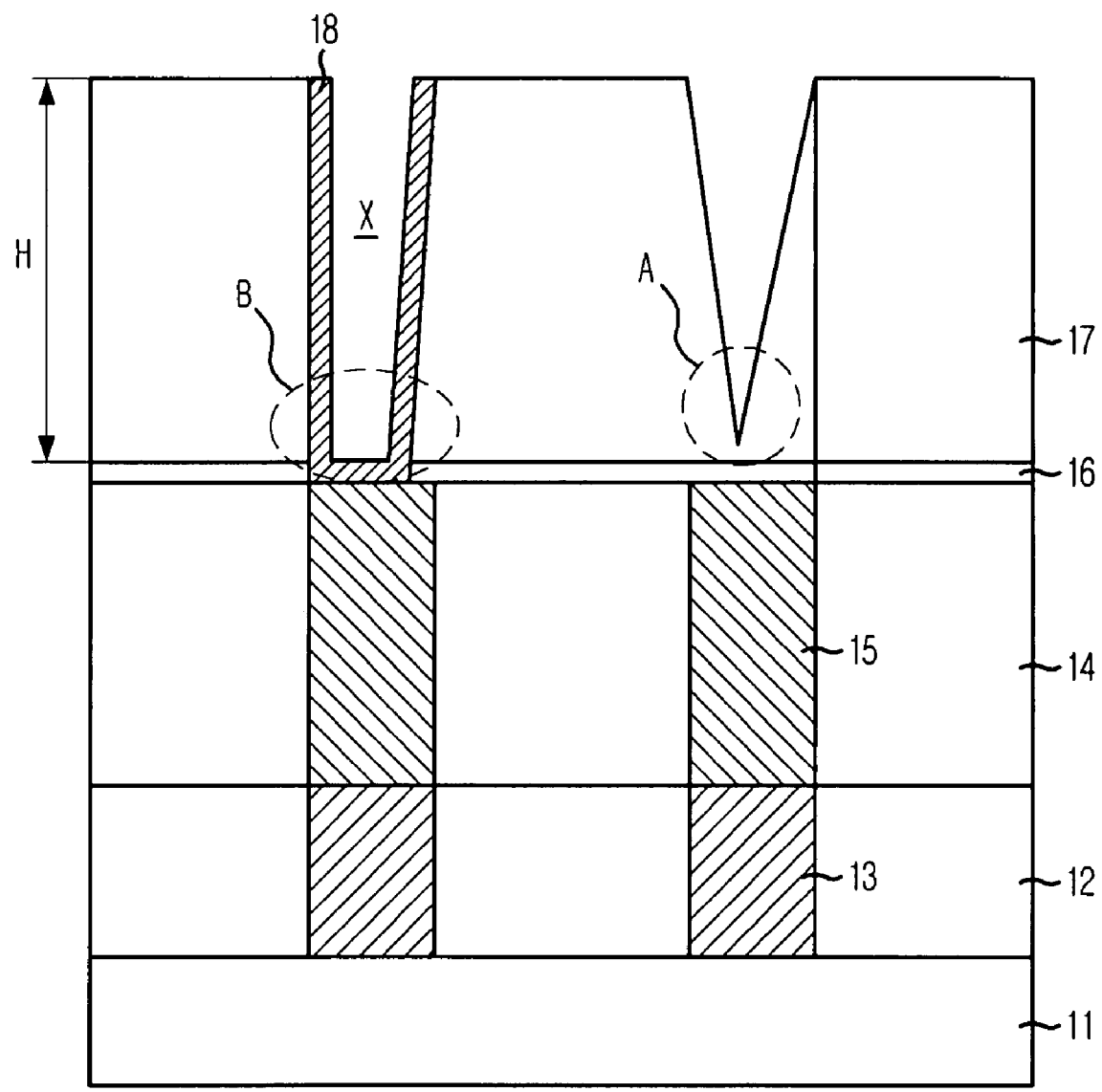
FIG. 1 is a sectional view to illustrate a method for fabricating a capacitor.
Figure 2A:
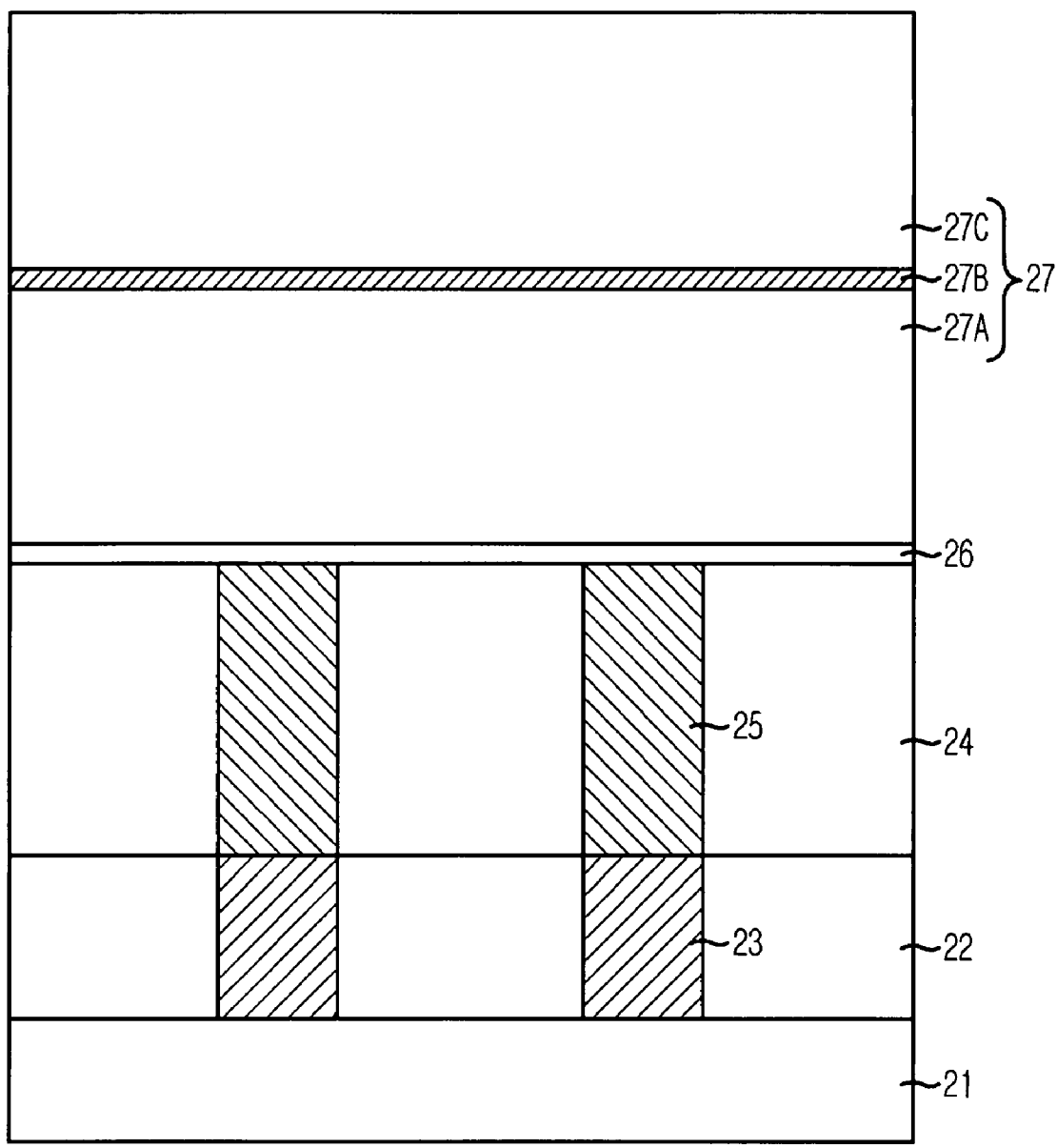

FIGS. 2A to 2F are sectional views to illustrate a method for fabricating a capacitor in accordance with an embodiment of the present invention. Referring to FIG. 2A, a first insulation layer 22 is formed over a substrate 21, and first contact plugs 23 (e.g., landing contact plugs) passing through the first insulation layer 22 are formed over the substrate 21. In detail, although not illustrated, the first insulation layer 22 is etched to form contact holes. A polysilicon layer is formed over the first insulation layer 22, filling the contact holes, and is etched to form the first contact plugs 23 inside the contact holes. Prior to forming the first contact plugs 23, although not illustrated, transistors may be formed.

A second insulation layer 24 is formed over the first insulation layer 22 and the first contact plugs, and etched to form other contact holes (not shown). Second contact plugs 25 (e.g., storage node contact plugs) fill the other contact holes. In detail, although not illustrated, the second insulation layer 24 is etched to form the other contact holes. A polysilicon layer is formed over the second insulation layer 24, filling the other contact holes, and etched or planarized employing a chemical mechanical polishing (CMP) treatment to form the second contact plugs 25 inside the other contact holes. Prior to forming the second contact holes, bit lines may be formed, and in such a case, the second insulation layer 24 may be formed in a structure of multiple insulation layers.

An etch barrier layer 26 and a first bottom electrode isolation structure 27 are formed over the above resultant structure. The etch barrier layer 26 includes a nitride-based material such as silicon nitride $Si_3N_4$, and functions as an etch barrier during subsequent etching. The first bottom electrode isolation structure 27 serves as an isolating insulation layer between bottom electrodes. In other words, opening regions where bottom electrodes are to be formed are formed in the first bottom electrode isolation structure 27. In the present embodiment, the first bottom electrode isolation structure 27 is formed in a triple-layer structure.

The first bottom electrode isolation structure 27 includes at least two different insulation layers having different etch selectivity ratios. For instance, the first bottom electrode isolation structure 27 may be a combination structure of an oxide-based layer and a nitride-based layer having different etch selectivity ratios. For anther example, the first bottom electrode isolation structure 27 is formed in a triple-layer structure including an oxide-based layer, a nitride-based layer, and an oxide-based layer.

In the present embodiment, the first bottom electrode isolation structure 27 is formed in a stack structure including a phosphosilicate glass (PSG) layer 27A, a silicon nitride layer 27B, and a plasma enhanced tetraethyl orthosilicate (PETEOS) layer 27C. The silicon nitride layer 27B has a thickness of about 100 Å to 300 Å. The silicon nitride layer 27B is thinner than the PSG layer 27A and the PETEOS layer 27C. The PSG layer 27A and the PETEOS layer 27C are formed thick to achieve sufficient capacitance. For instance, a total thickness of the PSG layer 27A and the PETEOS layer 27C is about 25,000 Å. An etching process for forming the aforementioned opening regions where bottom electrodes are to be formed is performed. The etching process is performed sequentially on the PETEOS layer 27C, the silicon nitride layer 27B, the PSG layer 27A, and the etch barrier layer 26 to expose the second contact plugs 25.

Referring to FIG. 2B, the PETEOS layer 27C is etched to form upper opening regions 28A. In particular, this etching is a self-aligned contact (SAC) etching using an etch gas that has an etch ratio of an oxide-based material to a nitride-based material at about 6 to 1 or above. Reference numerals 27D and 27X respectively represent a patterned PETEOS layer and a second bottom electrode isolation structure obtained after the SAC etching.

Due to this etch gas, when the PETEOS layer 27C (see FIG. 2A) is etched, the surface of the silicon nitride layer 27B is exposed, and the etching becomes slow on the silicon nitride layer 27B and fast on a portion of the PETEOS layer 27C above the silicon nitride layer 27B. In other words, the bottom portion of the PETEOS layer 27C is overly etched. As a result, the upper opening regions 28A have a widened bottom critical dimension.

For example, during the SAC etching of the PETEOS layer 27C, the etch gas is a mixture gas including $O_2$, $CHF_3$ and $CF_4$. At this time, the $O_2$, $CHF_3$ and $CF_4$ of the mixture gas have respective flow rates of about 3 sccm to 7 sccm, about 30 sccm to 50 sccm, and a about 20 sccm to 60 sccm. This mixture gas allows etching the PETEOS layer 27C about 6 times faster than the silicon nitride layer 27B (i.e., the etch ratio of the PETEOS layer 27C to the silicon nitride layer 27B at about 6:1 or above).

Figure 2C:
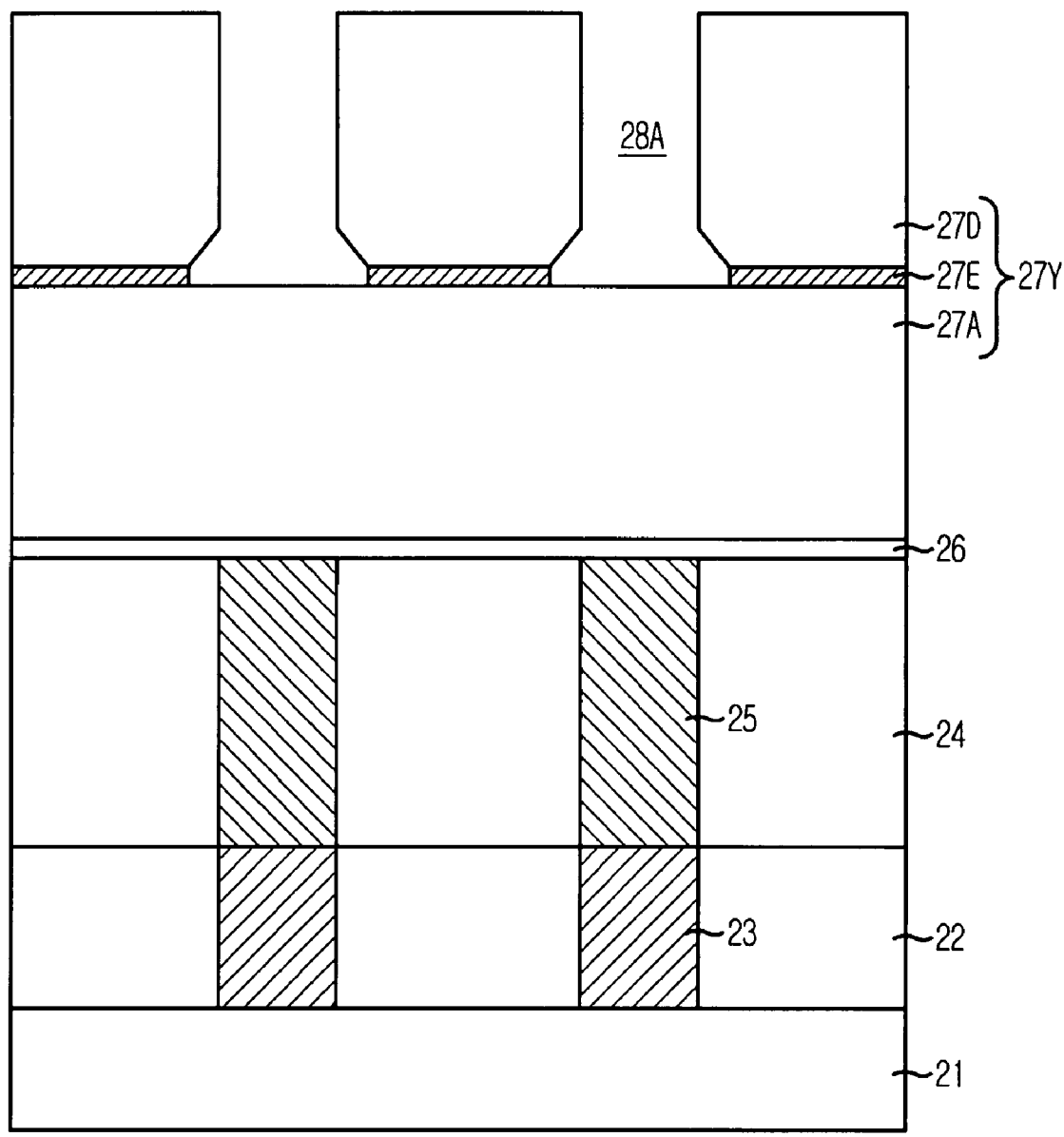

Referring to FIG. 2C, an exposed portion of the silicon nitride layer 27B is etched to become a patterned silicon nitride layer 27E. Reference numeral 27Y denotes a third bottom electrode isolation structure after this etching. Since the upper opening regions 28A have the widened bottom critical dimension, the silicon nitride layer 27B is etched in a self-aligned manner using the patterned PETEOS layer 27D as an etch barrier. As a result, the patterned silicon nitride layer 27E has a widened critical dimension. Particularly, the etching of the silicon nitride layer 27B uses an etch gas that has an etch selectivity ratio of an oxide-based material to a nitride-based material at about 1 to 1. A mixture gas including about 3 sccm to 7 sccm of $O_2$ and about 30 sccm to 60 sccm of $CHF_3$ is used as the etch gas.

Figure 2D:
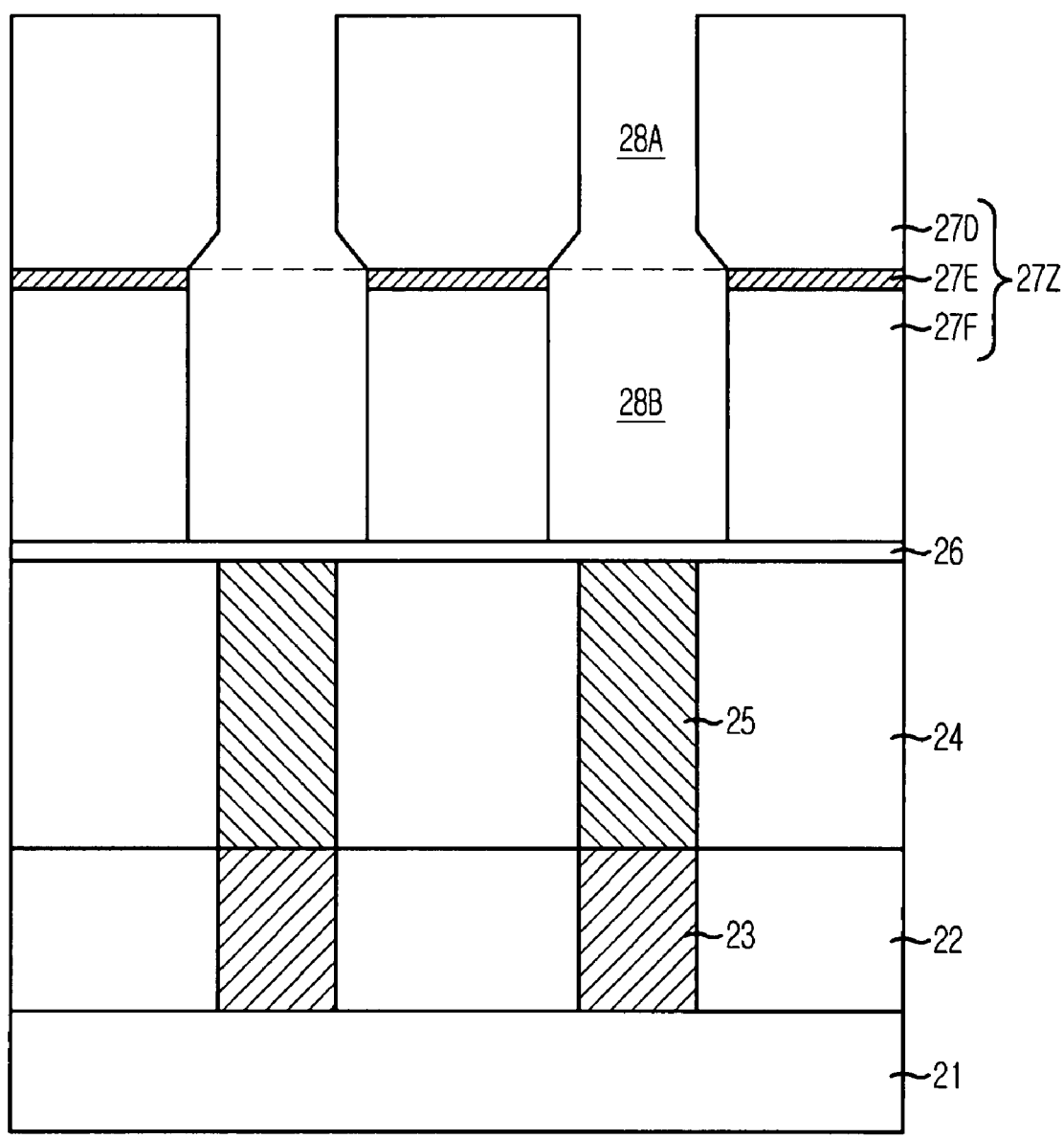

Referring to FIG. 2D, an exposed portion of the PSG layer 27A is etched to become a patterned PSG layer 27F. Reference numeral 27Z represents a fourth bottom electrode isolation structure after this etching. Since the patterned silicon nitride layer 27E has the widened bottom critical dimension, the PSG layer 27A is etched in a self-aligned manner using the patterned PETEOS layer 27D and the patterned silicon nitride layer 27E as an etch barrier. As a result, the patterned PSG layer 27F has a widened critical dimension.

After the formation of the patterned PSG layer 27F, lower opening regions 28B are formed. Thus, the finally formed opening regions include the upper opening regions 28A provided by etching the PETEOS layer 27C (see FIG. 2B) and the lower opening regions 28B provided by etching the PSG layer 27A (see FIG. 2D). As illustrated, the lower opening regions 28B have the bottom critical dimension wider than the upper opening regions 28A. Boundary regions each between the upper opening region 28A and the lower opening region 28B are negatively sloped due to the over etching of the bottom portion of the PETEOS layer 27C (see FIG. 2B).

Like the etching of the PETEOS layer 27C, the etching of the PSG layer 27A (see FIG. 2D) proceeds with employing the SAC etching and is designed to stop over the etch barrier layer 26. As a result, a bottom portion of the PSG layer 27A above the etch barrier layer 26 may be overly etched. For the SAC etching of the PSG layer 27A, a mixture gas including $O_2$, $CHF_3$ and $CF_4$ is used. A flow rate of $O_2$ ranges from about 3 sccm to 7 sccm; that of $CHF_3$ ranges from about 30 sccm to 50 sccm; and that of $CF_4$ ranges from about 20 sccm to 60 sccm. This mixture gas gives an etch selectivity ratio of the PSG layer 27A to the etch barrier layer 26 at about 6 to 1 or above. Also, this mixture gas gives an etch selectivity ratio of the PSG layer 27A to the patterned silicon nitride layer 27E at about 6 to 1 or above.

Figure 2E:
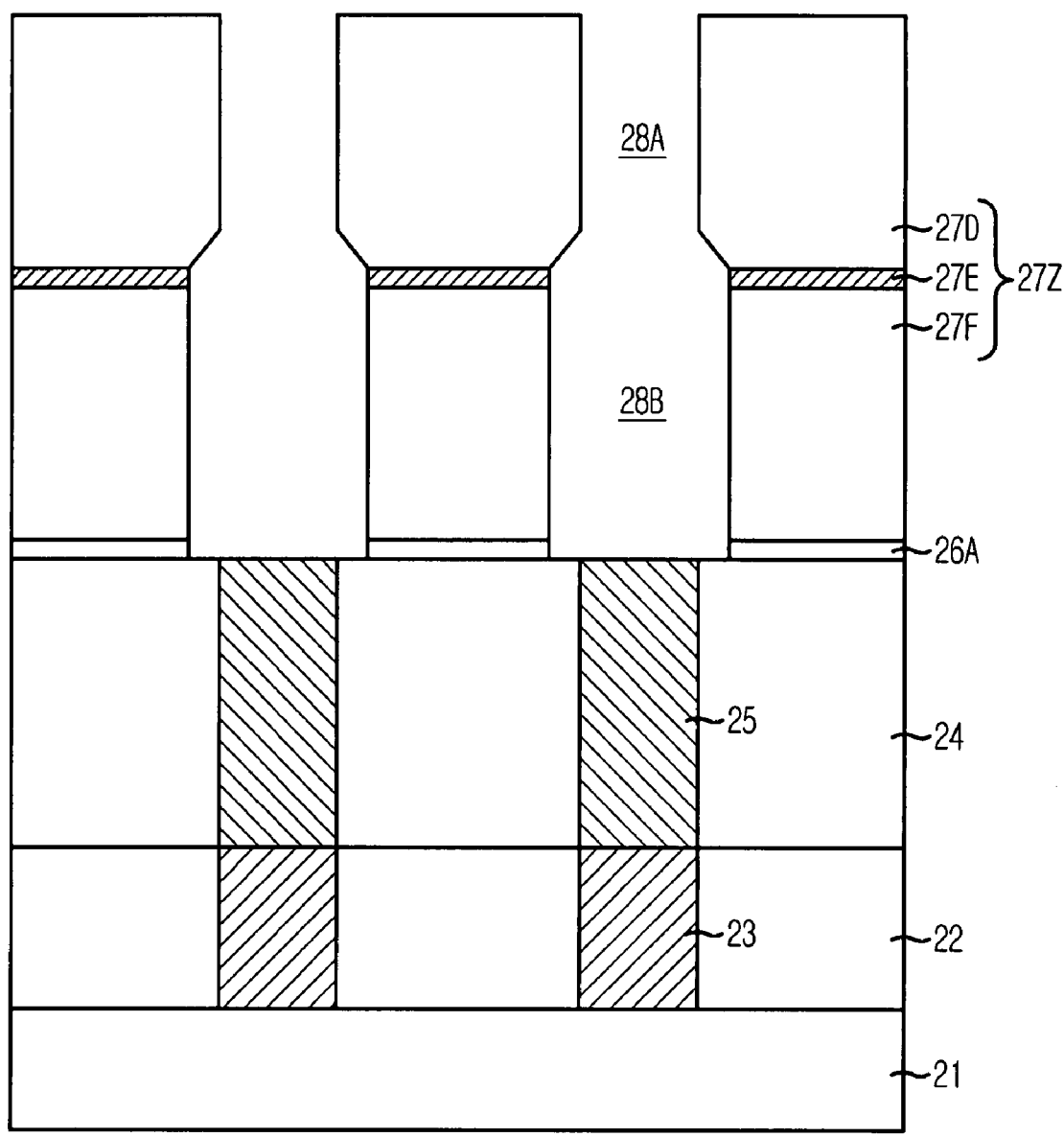

Referring to FIG. 2E, the etch barrier layer 26 is etched to expose the second contact plugs 25. Reference numeral 26A denotes a patterned etch barrier layer 26A after this etching. The etching of the etch barrier layer 26 including the nitride-based material uses an etch gas having an etch selectivity ratio of an oxide-based material to a nitride-based material at about 1 to 1. For instance, the etch gas is a mixture gas including about 3 sccm to 7 sccm of $O_2$ and about 30 sccm to 60 sccm of $CHF_3$.

Figure 2F:
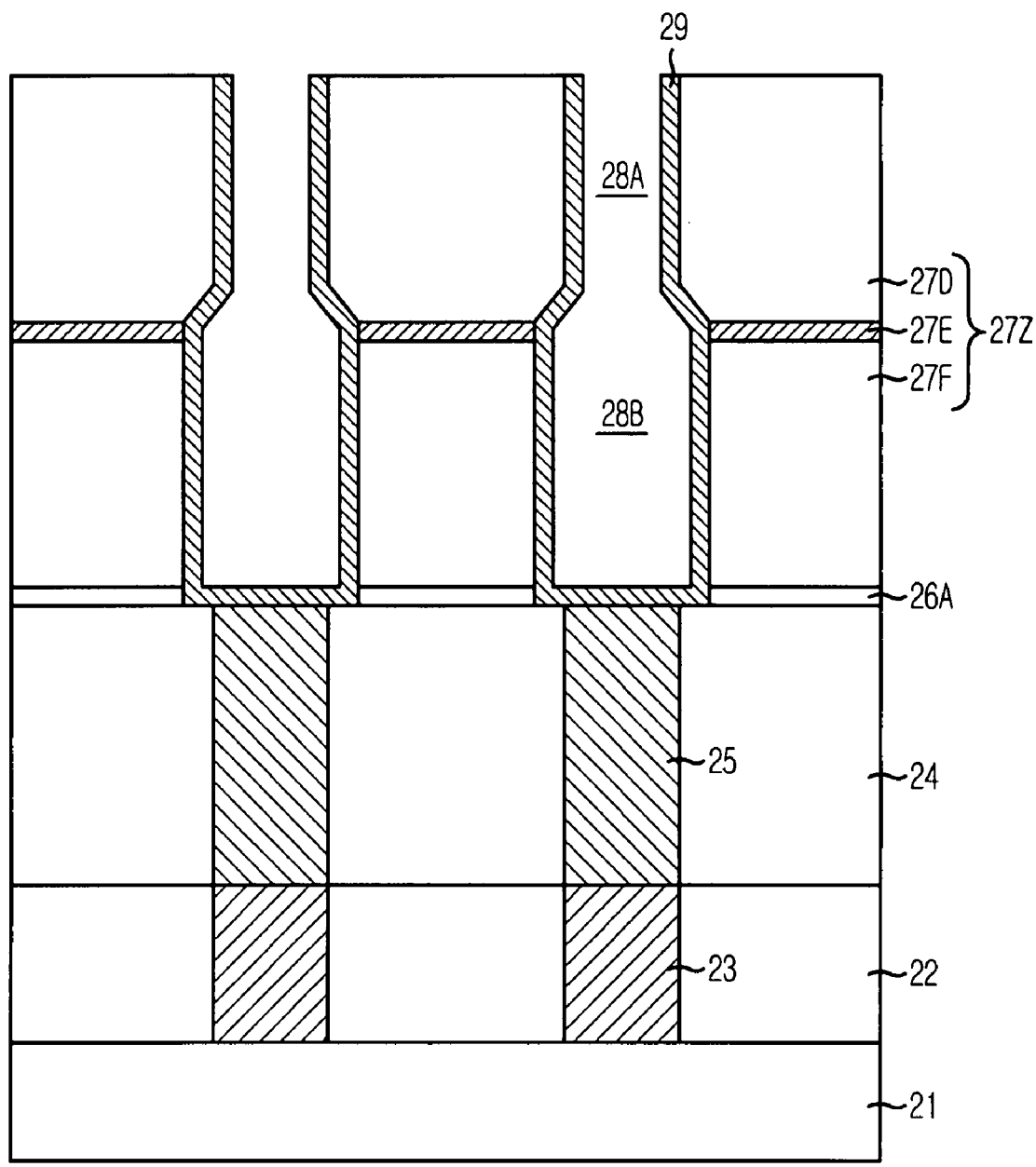

Referring to FIG. 2F, bottom electrodes 29 are formed inside the respective opening regions including the upper and lower opening regions 28A and 28B. The bottom electrodes 29 are formed by depositing a conductive layer over the opening regions and performing a bottom electrode isolation process on the conductive layer. The conductive layer includes polysilicon or metal. The bottom electrodes 29 have a wider area in a lower region than in an upper region. Although not illustrated, a dielectric layer and a top electrode are formed over the bottom electrodes.

According to various embodiments of the present invention, the bottom electrode isolation structure is formed in the triple-layer structure including the PSG layer, the silicon nitride layer and the PETEOS layer. Etch conditions for each layer of the bottom electrode isolation structure are set different from each other so as to reduce an improper etching and a decrease in the bottom areas of the opening regions. Since the area of each of the bottom electrodes can increase without increasing the height of the bottom electrode isolation structure, capacitors with a sufficient level of capacitance required for the large-scale of integration can be fabricated. Also, the insulation structure including insulation materials with different etch selectivity ratios is used to form the opening regions for upper portions of the contacts (e.g., storage node contacts). As a result, an improper etching and a decrease in the bottom areas of the opening regions cannot be incurred. This effect allows fabrication of semiconductor devices meeting the requirements for the large-scale of integration.

Although the triple-layer structure includes the PSG layer, the silicon nitride layer and the PETEOS layer, which are stacked over each other in this sequential order in the present embodiment, these layers can be stacked in different orders (e.g., in order of the PETEOS layer, the silicon nitride layer, and the PSG layer). Also, the PSG and PETEOS layers can include an oxide-based material, obtained by a high density plasma (HDP) method, or undoped silicate glass (USG). In other words, a combination insulation structure of an oxide-based material, a nitride-based material and an oxide-based material is allowable.

Also, when the bottom electrodes connected to storage node contacts are formed, the formation of the bottom electrode isolation structure is exemplified in the above embodiments of the present invention. In addition to the illustrative embodiments, the suggested method can be applied to the case of forming conductive layers connected to upper portions of contacts.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a semiconductor device, the method comprising:
    forming an insulation structure over a substrate structure including contact plugs;
    etching the insulation structure to form opening regions each of which has a lower opening portion having a critical dimension wider than an upper opening portion; and
    forming a conductive layer contacting the contact plugs inside the opening regions,
    wherein etching the bottom electrode isolation structure to form the opening regions comprises:
    forming an etch barrier layer over the substrate structure;
    forming the insulation structure including first to third insulation layers over the etch barrier layer, wherein the second insulation layer is interposed between the first insulation layer and the third insulation layer and has an etch selectivity ratio different from those of the first and third insulation layers;
    etching the third insulation layer to form the upper opening portions each having a widened bottom critical dimension;
    etching the second insulation layer and the first insulation layer in a self-aligned manner using a patterned third insulation layer as an etch barrier, the patterned third insulation layer including the upper opening portions with the widened bottom critical dimension; and
    etching the etch barrier layer.

2. The method of claim 1, wherein etching the third insulation layer comprises using an etch gas that provides an etch selectivity ratio of the third insulation layer to the second insulation layer at about 6 to 1 or above, so that a lower portion of the third insulation layer above the second insulation layer is widened relative to an upper portion of the third insulation layer.

3. The method of claim 1, wherein etching the first insulation layer comprises using an etch gas that provides an etch selectivity ratio of the first insulation layer to the second insulation layer at about 6 to 1 or above.

4. The method of claim 1, wherein etching the second insulation layer comprises using an etch gas that provides an etch selectivity ratio of the second insulation layer to each of the first and third insulation layers at about 1 to 1.

5. The method of claim 4, wherein the first and third insulation layers include oxide-based materials; and the second insulation layer and the etch barrier layer each include a nitride-based material.

6. The method of claim 5, wherein the first insulation layer includes phosphosilicate glass (PSG); the third insulation layer includes plasma enhanced tetraethyl orthosilicate (PETEOS); and the second insulation layer and the etch barrier layer each include silicon nitride.

7. The method of claim 6, wherein etching the first insulation layer and etching the third insulation layer comprise using a mixture gas including $O_2$, $CHF_3$ and $CF_4$.

8. The method of claim 7, wherein the $O_2$, $CHF_3$ and $CF_4$ of the mixture gas have respective flow rates of about 3 sccm to 7 sccm, about 30 sccm to 50 sccm, and about 20 sccm to 60 sccm.

9. The method of claim 6, wherein etching the second insulation layer comprises using a mixture gas including $O_2$ and $CHF_3$.

10. The method of claim 9, wherein the $O_2$ and $CHF_3$ of the mixture gas have respective flow rates of about 3 sccm to 7 sccm and about 30 sccm to 60 sccm.

11. The method of claim 6, wherein etching the etch barrier layer comprises using a mixture gas including $O_2$ and $CHF_3$.

12. The method of claim 11, wherein the $O_2$ and $CHF_3$ of the mixture gas have respective flow rates of about 3 sccm to 7 sccm and about 30 sccm to 60 sccm.

13. The method of claim 5, wherein the second insulation layer is formed to a thickness of about 100 Å to 300 Å.

14. A method for fabricating a capacitor, the method comprising:
    forming a bottom electrode isolation structure over a substrate structure including storage node contact plugs;
    etching the bottom electrode isolation structure to form opening regions each of which has a lower opening portion having a critical dimension wider than an upper opening portion; and
    forming bottom electrodes contacting the storage node contact plugs inside the opening regions, respectively,
    wherein etching the bottom electrode isolation structure to form the opening regions comprises:
    forming an etch barrier layer over the substrate structure;
    forming the bottom electrode isolation structure including first to third insulation layers over the etch barrier layer, wherein the second insulation layer is interposed between the first insulation layer and the third insulation layer and has an etch selectivity ratio different from those of the first and third insulation layers;
    etching the third insulation layer to form the upper opening portions each having a widened bottom critical dimension;
    etching the second insulation layer and the first insulation layer in a self-aligned manner using a patterned third insulation layer as an etch barrier, the patterned third insulation layer including the upper opening portions with the widened bottom critical dimension; and
    etching the etch barrier layer.

15. The method of claim 14, wherein etching the third insulation layer comprises using an etch gas that provides an etch selectivity ratio of the third insulation layer to the second insulation layer at about 6 to 1 or above, so that a lower portion of the third insulation layer above the second insulation layer is widened relative to an upper portion of the third insulation layer.

16. The method of claim 14, wherein etching the first insulation layer comprises using an etch gas that provides an etch selectivity ratio of the first insulation layer to the second insulation layer at about 6 to 1 or above.

17. The method of claim 14, wherein etching the second insulation layer comprises using an etch gas that provides an etch selectivity ratio of the second insulation layer to each of the first and third insulation layers at about 1 to 1.

18. The method of claim 17, wherein the first and third insulation layers include oxide-based materials; and the second insulation layer and the etch barrier layer each include a nitride-based material.

19. The method of claim 18, wherein the first insulation layer includes phosphosilicate glass (PSG); the third insulation layer includes plasma enhanced tetraethyl orthosilicate (PETEOS); and the second insulation layer and the etch barrier layer each include silicon nitride.

20. The method of claim 18, wherein etching the first insulation layer and etching the third insulation layer comprise using a mixture gas including $O_2$, $CHF_3$ and $CF_4$.

21. The method of claim 20, wherein the $O_2$, $CHF_3$ and $CF_4$ of the mixture gas have respective flow rates of about 3 sccm to 7 sccm, about 30 sccm to 50 sccm, and about 20 sccm to 60 sccm.

22. The method of claim 18, wherein etching the second insulation layer comprises using a mixture gas including $O_2$ and $CHF_3$.

23. The method of claim 22, wherein the $O_2$ and $CHF_3$ of the mixture gas have respective flow rates of about 3 sccm to 7 sccm and about 30 sccm to 60 sccm.

24. The method of claim 18, wherein the second insulation layer is formed to a thickness of about 100 Å to 300 Å.

25. The method of claim 18, wherein etching the etch barrier layer comprises using a mixture gas including $O_2$ and $CHF_3$.

26. The method of claim 25, wherein the $O_2$ and $CHF_3$ of the mixture gas have respective flow rates of about 3 sccm to 7 sccm and about 30 sccm to 60 sccm.

* * * * *